(12) United States Patent
Ranganathan

(10) Patent No.: US 7,119,585 B2
(45) Date of Patent: Oct. 10, 2006

(54) SAMPLE AND HOLD CIRCUIT BASED ON AN ULTRA LINEAR SWITCH

(75) Inventor: Sumant Ranganathan, Sunnyvale, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/927,416

(22) Filed: Aug. 27, 2004

(65) Prior Publication Data
US 2005/0057283 A1 Mar. 17, 2005

Related U.S. Application Data

(60) Provisional application No. 60/500,373, filed on Sep. 5, 2003.

(51) Int. Cl.
*G11C 27/02* (2006.01)

(52) U.S. Cl. .......................................... 327/94

(58) Field of Classification Search ............. 327/91, 327/93, 94, 337, 554; 341/122
See application file for complete search history.

(56) References Cited

U.S. PATENT DOCUMENTS 5,909,131 A * 6/1999 Singer et al. ................ 327/91
5,990,819 A * 11/1999 Fujimori ..................... 341/150
6,624,779 B1 * 9/2003 Hochschild ................. 341/172

* cited by examiner

Primary Examiner—My-Trang Nu Ton
(74) Attorney, Agent, or Firm—Sterne Kessler Goldstein & Fox PLLC

(57) ABSTRACT

A sample and hold circuit including a plurality of input signal sampling switches using native NMOS transistors in combination with switched bulk PMOS transistors. The input signal sampling switches input a differential input signal and output an intermediate differential signal. A plurality of capacitors are connected to the intermediate differential signal. A plurality of summing junction switches receive charge stored on the plurality of capacitors, and output a differential sampled and held charge to the summing junction. The plurality of input signal sampling switches include first, second, third, and fourth switches each having an input and an output. Inputs of the first and third switches are connected to a first voltage of the differential input voltage. Inputs of the second and fourth switches are connected to a second voltage of the differential input voltage. Outputs of the first and second switches are connected together and to an input of a first capacitor of the plurality of capacitors. Outputs of the third and fourth switches are connected together and to an input of a second capacitor of the plurality of capacitors.

17 Claims, 6 Drawing Sheets

SAMPLE AND HOLD CIRCUIT BASED ON AN ULTRA LINEAR SWITCH

CROSS REFERENCE TO RELATED APPLICATIONS

This application claims priority to U.S. Provisional Patent Application No. 60/500,373, filed: Sep. 5, 2003, entitled SAMPLE AND HOLD CIRCUIT BASED ON AN ULTRA LINEAR SWITCH, and is related to U.S. patent application Ser. No. 10/377,023, filed: Mar. 3, 2003, entitled: ANALOG CMOSFET SWITCH WITH LINEAR ON RESISTANCE, which are both incorporated by reference herein.

BACKGROUND OF THE INVENTION

1. Field of the Invention

The present invention relates to sample and hold circuits used in high-speed high resolution analog-to-digital converters.

2. Related Art

Sampling distortion is one of the main causes of overall distortion performance of an analog to digital converter (ADC). The two main mechanisms for the sampling distortion are the following:

Track mode distortion: typically the sampled voltage onto the sampling capacitor follows the input voltage with a lag proportional to $T_{on}=R_{on}*(C_{samp}+C_{par})$ (where $C_{par}$ is the parasitic capacitance from the source, drain junctions of the NMOS and PMOS devices in the switch to the bulk). Since $R_{on}$ and $C_{par}$ of the switch vary with the signal for a CMOS switch, this causes track mode distortion.

Switch capacitor charge injection errors: in a normal CMOS sampling structure, by using non overlapping clocks and early and late phases to clock the summing junction switch and the signal conducting switch respectively the charge injection errors due to the signal conducting switch is prevented from appearing at the output. The charge injection errors due to the summing junction switches is to the first order signal independent and therefore does not lead to significant distortion. However, a second order effect which causes distortion is that even though the charge stored on the summing junction switch is signal independent, the manner in which the charge divides when that switch is turned off, depends on the impedance seen on the left and the right side of the switch. The impedance on the left side of the switch is signal dependent and hence the charge division becomes signal dependent. This again shows up as distortion at the output.

Bootstrapping has been used in an attempt to solve this problem. It results in very high linearity, but the extra bootstrap capacitor needed is usually very large and hence becomes very area intensive.

Regular CMOS switches have been used, which works for large supply voltages (Vdd=>5V), but cannot get very high linearity for Vdd<=3.3 V while trying to sample large input voltages (about 2–3 V peak to peak differential).

Replica bridge networks have been used to keep the signal side switch operating at a constant $R_{on}$. This approach results in high linearity, but the overhead of the replica network and the replica amplifiers is both area intensive and power hungry.

SUMMARY OF THE INVENTION

The present invention is directed to a sample and hold circuit based on an ultra linear switch that substantially obviates one or more of the problems and disadvantages of the related art.

There is provided a sample and hold circuit including a plurality of input signal sampling switches using native NMOS transistors. The input signal sampling switches input a differential input signal and output an intermediate differential signal. A plurality of capacitors is connected to the intermediate differential signal. A plurality of summing junction switches receive charge stored on the plurality of capacitors, and output a differential sampled and held charge to the summing junction. The plurality of input signal sampling switches include first, second, third and fourth switches each having an input and an output. Inputs of the first and third switches are connected to a first voltage of the differential input voltage. Inputs of the second and fourth switches are connected to a second voltage of the differential input voltage. Outputs of the first and second switches are connected together and to an input of a first capacitor of the plurality of capacitors. Outputs of the third and fourth switches are connected together and to an input of a second capacitor of the plurality of capacitors.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

The present invention uses native devices or switched bulk NMOS devices in combination with switched bulk PMOS for the signal-side sampling switch to improve linearity in a sample and hold circuit. Such use of native devices or switched bulk NMOS devices in combination with switched bulk PMOS improves track mode distortion tremendously by lowering the $T_{on}$ (and $R_{on}$) and the variation in $T_{on}$ (and $R_{on}$) of the signal side switch in the sample and hold for a given area allocated for the switch. The much smaller $R_{on}$ and variation in $R_{on}$ when compared to a regular CMOS switch alleviates the second order effect of charge injection mismatch in the summing junction switch.

Figure 1A:
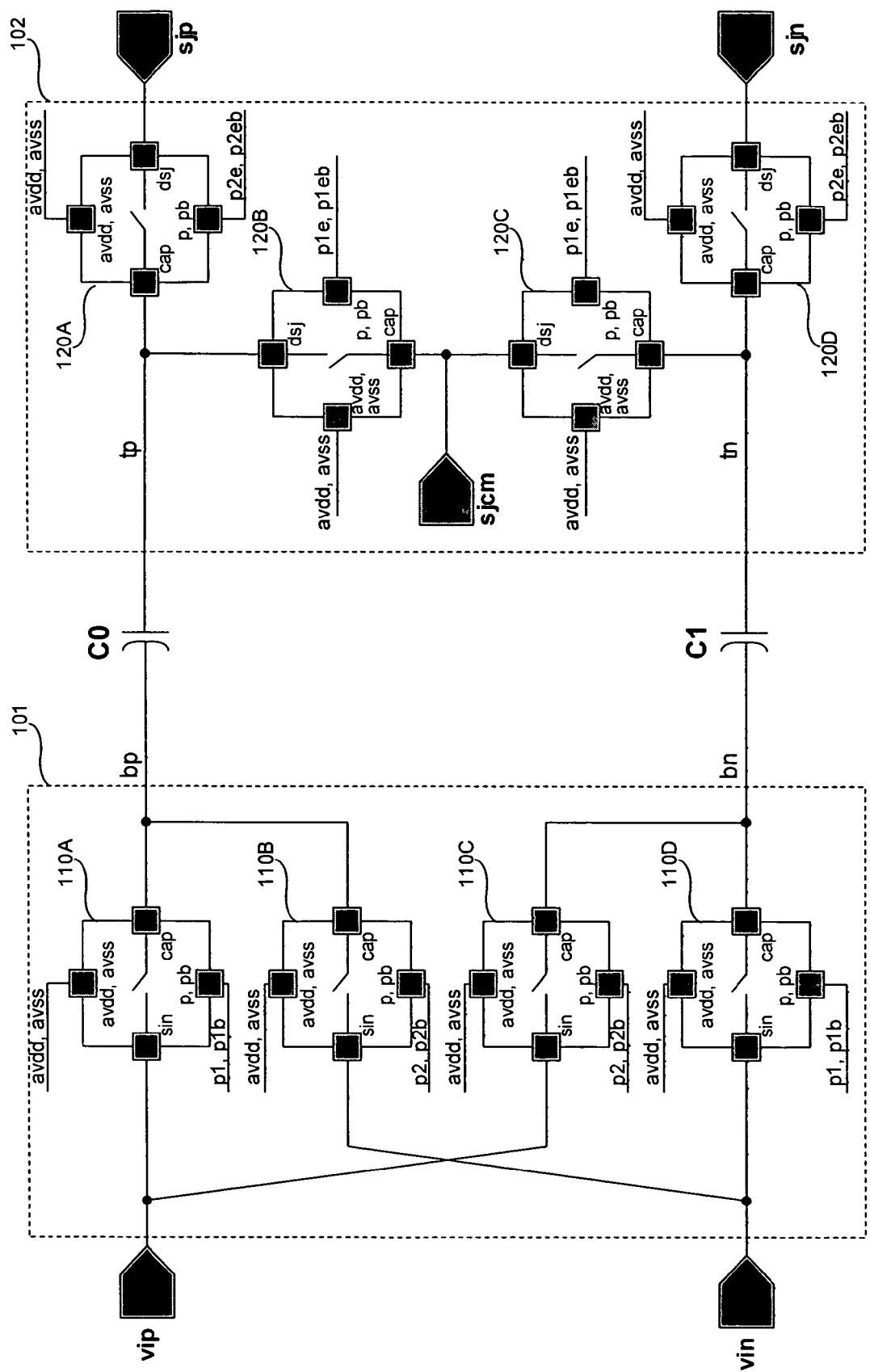
FIGS. 1A–1B show an implementation of a sampling network with native NMOS switches in combination with switched bulk PMOS.
Figure 1B:
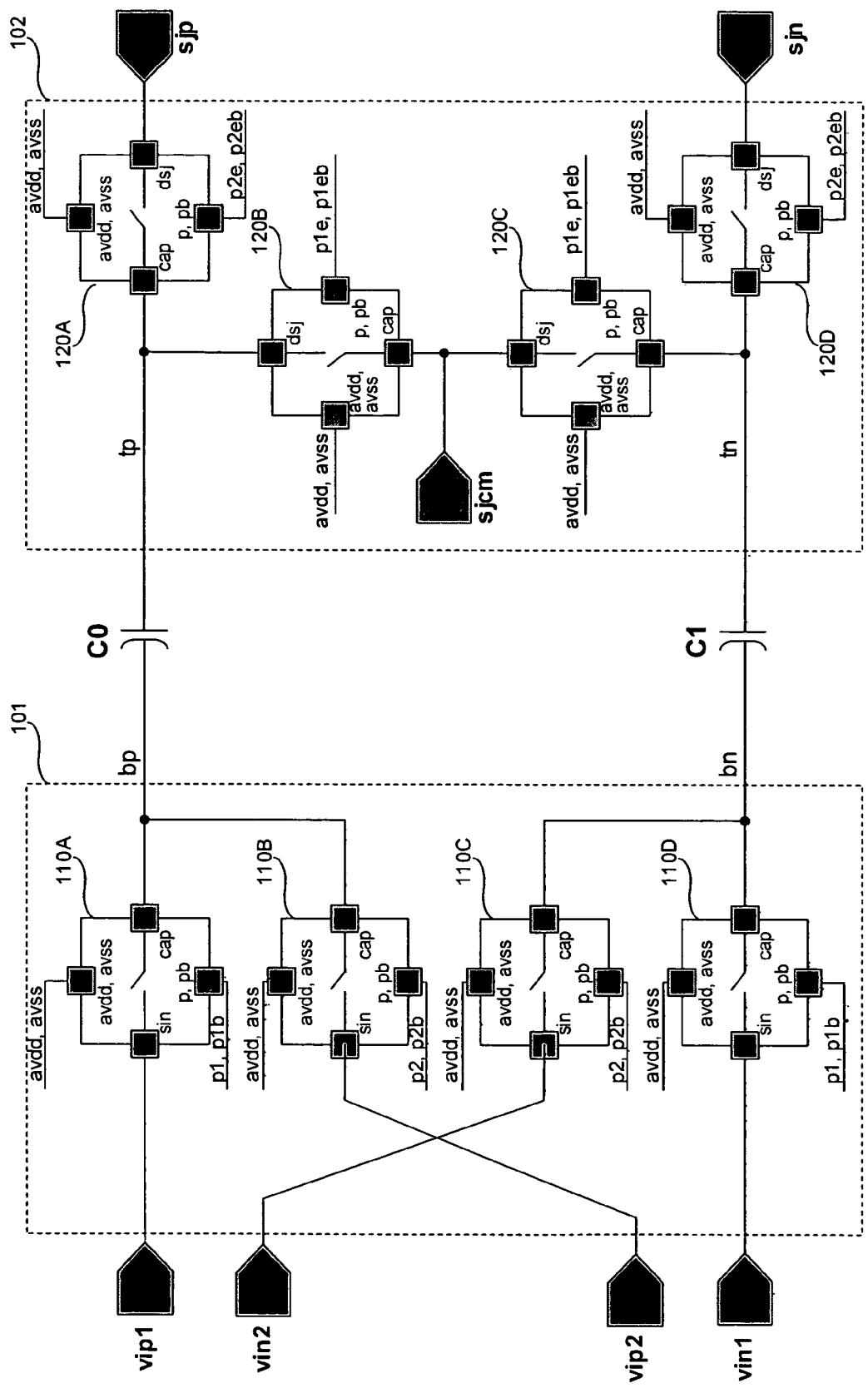

FIGS. 1A–1B show an implementation of a sampling network with native NMOS switches. FIG. 1A shows the case of two differential inputs, and FIG. 1B shows the case where the two differential inputs are further divided in two. As shown in FIG. 1A, the sample and hold circuit includes a network of input signal sampling switches 101. The network 101 includes switches 110A, 110B, 110C, 110D, connected as shown in FIG. 1A. Two sample capacitors C0, C1 receive the input differential voltages through the network 101, and output the sampled charge to the summing junction through a network 102 of summing junction switches 120A, 120B, 120C, 120D, connected as shown. The circuit samples the input to sjcm during the clock phase phi1. It then "dumps" or transfers the charge stored on the capacitors C0, C1 to sjp, sjn during phi2, while also taking a second input sample (½ cycle delayed).

Figure 2A:
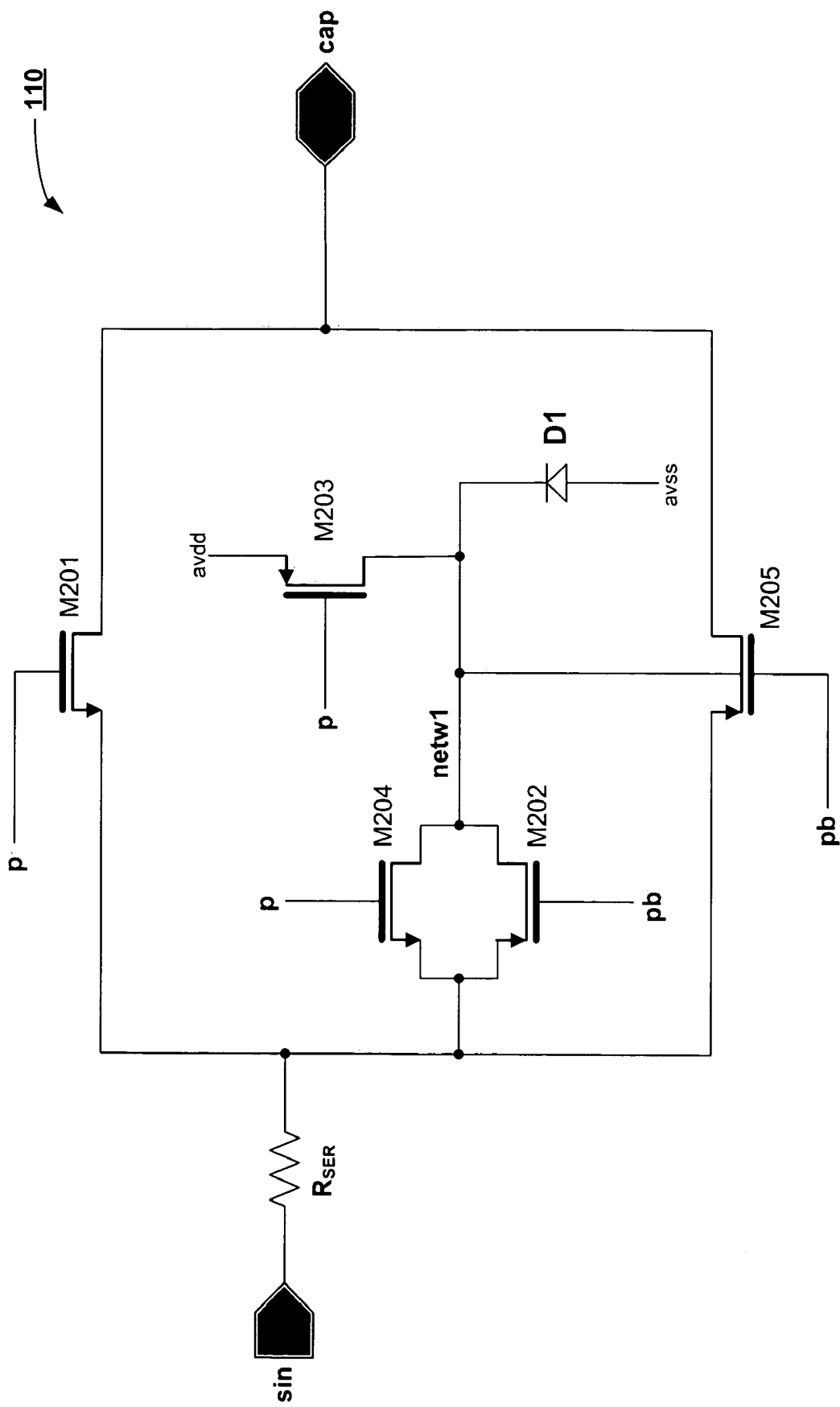
FIGS. 2A–2B show the circuit diagram for a signal-side sampling switch implemented with native NMOS in combination with switched bulk PMOS.

FIG. 2A shows a circuit diagram for a signal-side sampling switch 110 implemented with native NMOS transistors M201 and M204 in combination with switched bulk PMOS transistor M205 and diode D1, all connected as shown.

For the native NMOS devices, common mode input voltage $Vcm_{in}$ should be $\geq 1.15V$ to ensure that the native device turns off sufficiently (THD>100 dB for 1.1 V peak to peak differential). (This is specific to the property of the native NMOS device and may not be exactly the same for a native device fabricated at different foundries). $R_{SER}=4–6$ Ohms improves interface THD performance when this switch is sampling from an input buffer. (The exact value of $R_{SER}$ is less important than its presence in the circuit. For a different sizing of the transistors in the signal sampling switch 110, the value of $R_{SER}$ for optimal performance can be different, e.g., 7–10 ohms, or 3–10 ohms, or even 0–10 ohms).

Figure 2B:
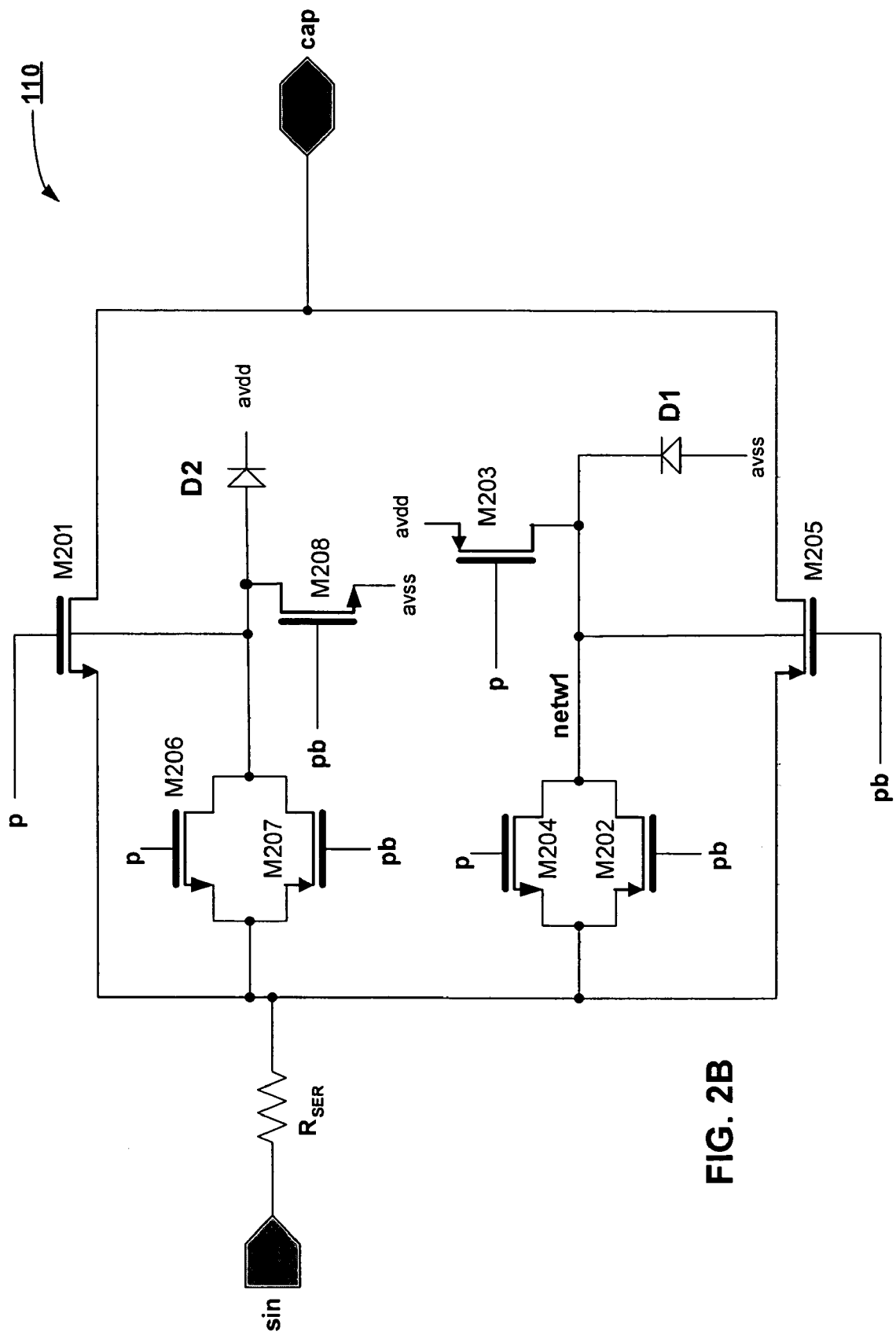

FIG. 2B is an alternative embodiment, showing bulk connections to the transistor M201, and a corresponding addition of transistors M206–M208 and the diode D2, as shown in the figure.

Figure 3:
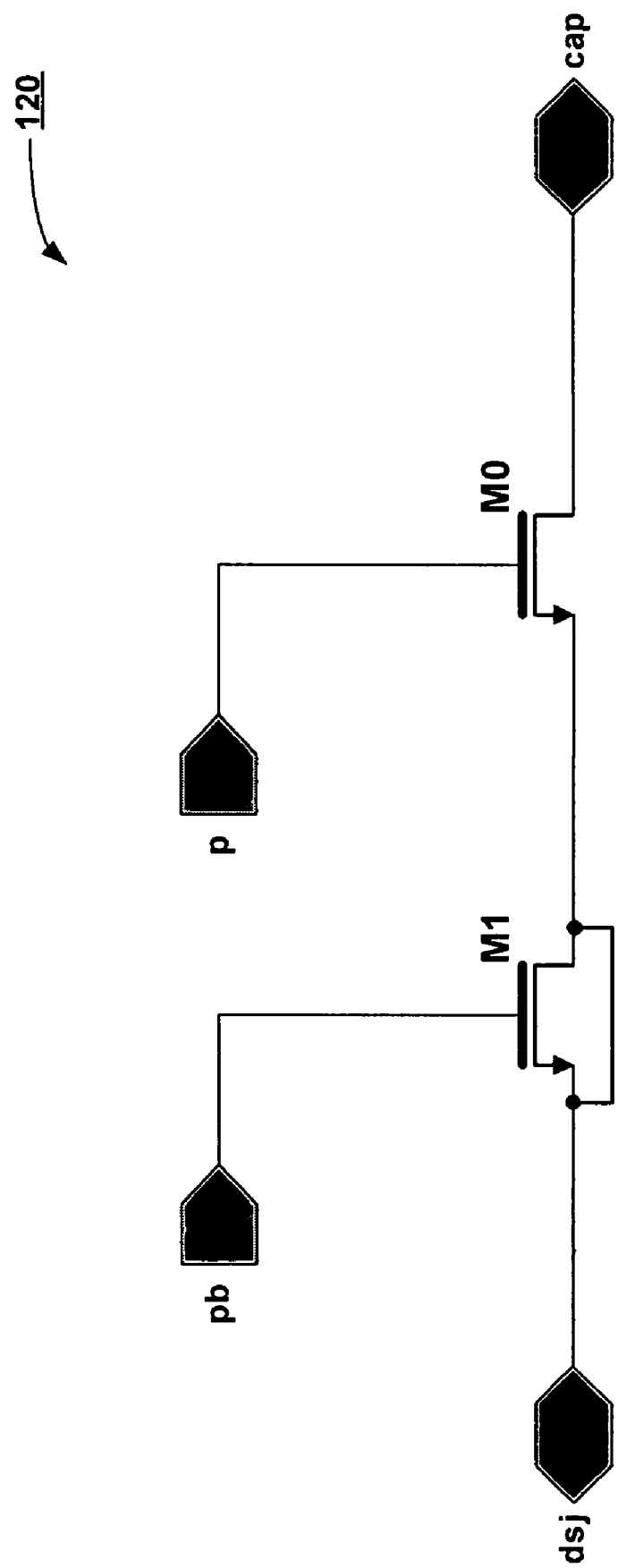
FIG. 3 shows an implementation of a summing junction switch of FIG. 1A.

The summing junction switches 120 can be implemented with a dummy device to reduce the effect of charge injection, such as the transistors M0, M1, shown in FIG. 3. (Thus, in FIG. 3, a drain and a source of transistor M1 should be shorted together, since it is a dummy switch, and its only purpose is for charge injection cancellation.) Summing junction switches 120 include a dummy switch to reduce charge injection on integrator op amp summing junction. sjp, sjn have approximately 100 mV common mode jump between phi1 and phi2 if there is no dummy switch. The common mode jump reduces to less than 10 mV with the dummy switch. The switch 120 corresponds to a fixed value of sampling capacitance, for example, 100 fF.

Figure 4:
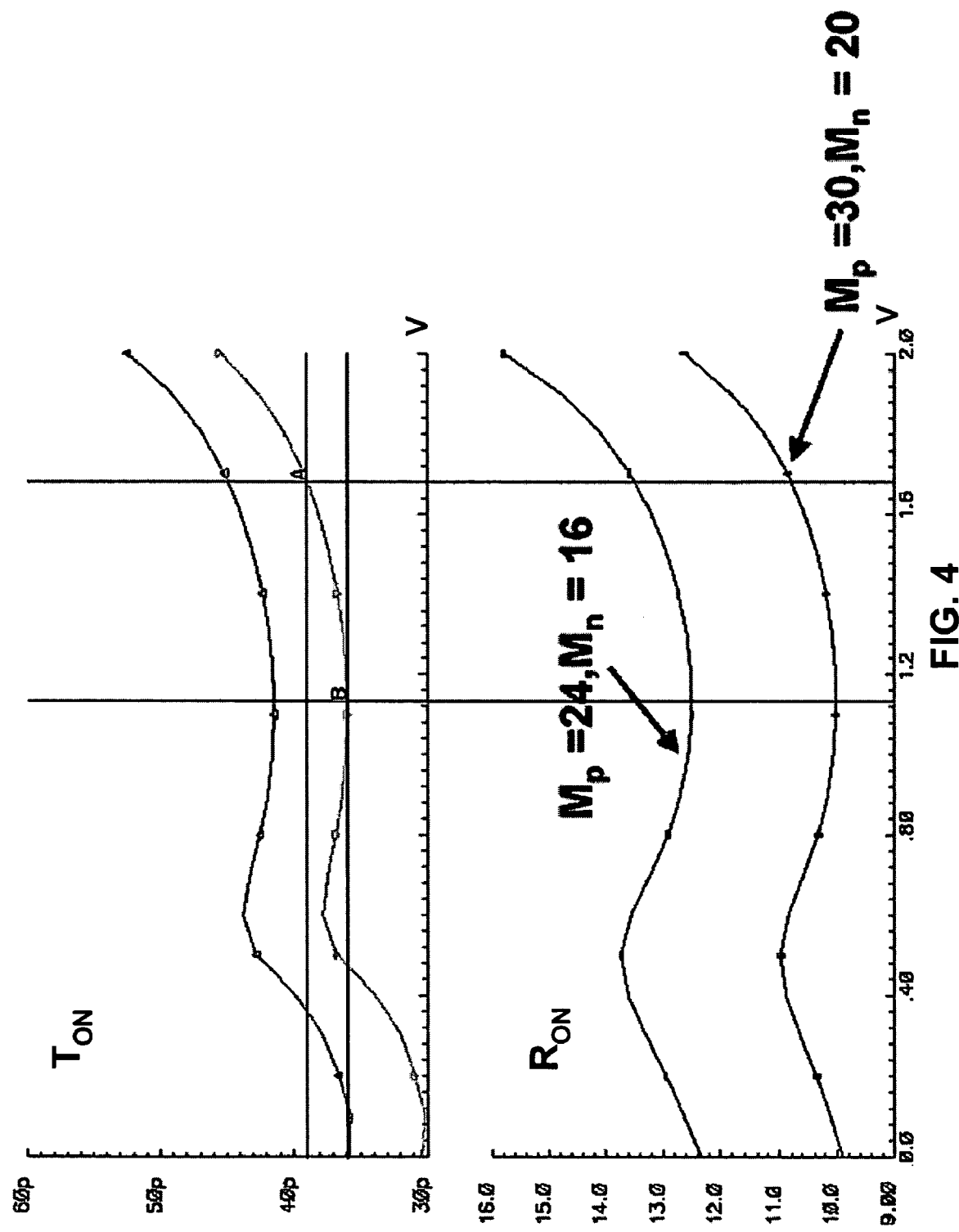
FIG. 4 shows $R_{on}$ and $T_{on}$ variation of the signal-side sampling switch of FIG. 2A for two different device sizes.

FIG. 4 shows the on-resistance $R_{on}$ and turn on time $T_{on}$ variation of the signal-side sampling switch 110 shown in FIG. 2A for two different device sizes (multiplicity factors M). In FIG. 4, $\delta T_{on}$ (variation)$\approx 3$ ps for peak to peak signal range (0.5 V–1.7 V). $2\pi f \delta T<10^{-5}$ is needed for >100 dB THD ($\delta T$ around sine wave zero crossing). $\delta T \leq 1.44$ ps for f=1.1 MHz near zero crossing.

One of the advantages of the invention is that this structure needs no additional power to drive replica amplifiers. The area overhead is minimal for using non-minimum channel native devices, because the reduction in threshold voltage of the native device more than compensates for the increase in channel length. The circuit of the present invention results in a very wide highly linear dynamic input range even for very low supply voltages. Additional 3–5 bits of linearity may be obtained.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

What is claimed is:

1. A sample and hold circuit comprising:
   a plurality of input signal sampling switches using native NMOS transistors in combination with switched bulk PMOS transistors, the input signal sampling switches inputting a differential input signal and outputting an intermediate differential signal;
   a plurality of capacitors connected to the intermediate differential signal; and
   a plurality of summing junction switches receiving charges from the plurality of capacitors, and outputting a differential sampled and held charge.

2. The sample and hold circuit of claim 1, wherein the plurality of input signal sampling switches include first, second, third, and fourth switches each having an input and an output,
   wherein inputs of the first and third switches are connected to a first voltage of the differential input voltage,
   wherein inputs of the second and fourth switches are connected to a second voltage of the differential input voltage,
   wherein outputs of the first and second switches are connected together and to an input of a first capacitor of the plurality of capacitors, and
   wherein outputs of the third and fourth switches are connected together and to an input of a second capacitor of the plurality of capacitors.

3. The sample and hold circuit of claim 1, wherein each of the plurality of input signal sampling switches includes:
   a resistor connected to an input of the input signal sampling switch;
   a first PMOS transistor and a native NMOS transistor connected in parallel between the resistor and an output of the input signal sampling switch;
   a second PMOS and a second NMOS transistor connected in parallel, their inputs connected to the resistor and their outputs tied together and to a bulk of the first PMOS transistor; and
   a third PMOS transistor whose drain is connected to the bulk of the first PMOS transistor and whose source is connected to a power supply.

4. The sample and hold circuit of claim 3, wherein the resistor is approximately 4–6 ohms.

5. The sample and hold circuit of claim 3, wherein the resistor is approximately 7–10 ohms.

6. The sample and hold circuit of claim 3, wherein the resistor is approximately 0–10 ohms.

7. The sample and hold circuit of claim 3, wherein a bulk of the first PMOS transistor is connected to its source when the corresponding input signal sampling switches are turned on, and connected to Vdd when the corresponding input signal sampling switches are turned off.

8. The sample and hold circuit of claim 1, wherein the plurality of input signal sampling switches include first, second, third, and fourth switches each having an input and an output,
wherein an input of the first switch is connected to a first voltage of the first differential input voltage,
wherein an input of the second switch is connected to a first voltage of the second differential input voltage,
wherein an input of the third switch is connected to a second voltage of the first differential input voltage,
wherein an input of the fourth switch is connected to a second voltage of the second differential input voltage,
wherein outputs of the first and second switches are connected together and to an input of a first capacitor of the plurality of capacitors, and
wherein outputs of the third and fourth switches are connected together and to an input of a second capacitor of the plurality of capacitors.

9. A sample and hold circuit comprising:
a plurality of input signal sampling switches using switched bulk NMOS transistors in combination with switched bulk PMOS transistors, the input signal sampling switches inputting a differential input signal and outputting an intermediate differential signal;
a plurality of capacitors connected to the intermediate differential signal; and
a plurality of summing junction switches receiving charges from the plurality of capacitors, and outputting a differential sampled and held charge.

10. The sample and hold circuit of claim 9, wherein the plurality of input signal sampling switches include first, second, third, and fourth switches each having an input and an output,
wherein inputs of the first and third switches are connected to a first voltage of the differential input voltage,
wherein inputs of the second and fourth switches are connected to a second voltage of the differential input voltage,
wherein outputs of the first and second switches are connected together and to an input of a first capacitor of the plurality of capacitors, and
wherein outputs of the third and fourth switches are connected together and to an input of a second capacitor of the plurality of capacitors.

11. The sample and hold circuit of claim 9, wherein each of the plurality of input signal sampling switches includes:
a resistor connected to an input of the input signal sampling switch;
a first PMOS transistor and a first NMOS transistor connected in parallel between the resistor and an output of the input signal sampling switch;
a second PMOS transistor and a second NMOS transistor connected in parallel, their inputs connected to the resistor and their outputs tied together and to a bulk of the first PMOS transistor;
a third PMOS transistor whose drain is connected to a bulk of the first PMOS transistor and whose source is connected to a power supply;
a fourth PMOS and a third NMOS transistor connected in parallel, their inputs connected to the resistor and their outputs tied together and to a bulk of the first NMOS transistor; and
a fourth NMOS transistor whose drain is connected to a bulk of the first NMOS transistor and whose source is connected to ground.

12. The sample and hold circuit of claim 11, wherein the resistor is approximately 4–6 ohms.

13. The sample and hold circuit of claim 11, wherein the resistor is approximately 7–10 ohms.

14. The sample and hold circuit of claim 11, wherein the resistor is approximately 0–10 ohms.

15. The sample and hold circuit of claim 11, wherein a bulk of the first PMOS transistor is connected to its source when the corresponding input signal sampling switches are turned on, and connected to Vdd when the corresponding input signal sampling switches are turned off.

16. The sample and hold circuit of claim 11, wherein a bulk of the first NMOS transistor is connected to its source when the corresponding input signal sampling switches are turned on, and connected to ground when the corresponding input signal sampling switches are turned off.

17. The sample and hold circuit of claim 9, wherein the plurality of input signal sampling switches include first, second, third, and fourth switches each having an input and an output,
wherein an input of the first switch is connected to a first voltage of the first differential input voltage,
wherein an input of the second switch is connected to a first voltage of the second differential input voltage,
wherein an input of the third switch is connected to a second voltage of the first differential input voltage,
wherein an input of the fourth switch is connected to a second voltage of the second differential input voltage,
wherein outputs of the first and second switches are connected together and to an input of a first capacitor of the plurality of capacitors, and
wherein outputs of the third and fourth switches are connected together and to an input of a second capacitor of the plurality of capacitors.

* * * * *